(12) United States Patent
Eriksen et al.

(10) Patent No.: US 9,019,712 B2
(45) Date of Patent: Apr. 28, 2015

(54) ELECTRICAL SUBSEA NODE

(75) Inventors: Mikael Kristian Eriksen, Trondheim (NO); Karstein Kristiansen, Trondheim (NO); Kjetil Zsolt Volent, Trondheim (NO)

(73) Assignee: Siemens Aktiengesellschaft, Munich (DE)

( * ) Notice: Subject to any disclaimer, the term of this patent is extended or adjusted under 35 U.S.C. 154(b) by 224 days.

(21) Appl. No.: 13/876,458

(22) PCT Filed: Feb. 7, 2011

(86) PCT No.: PCT/EP2011/051716
§ 371 (c)(1),
(2), (4) Date: May 22, 2013

(87) PCT Pub. No.: WO2012/041531
PCT Pub. Date: Apr. 5, 2012

(65) Prior Publication Data
US 2013/0242514 A1    Sep. 19, 2013

(30) Foreign Application Priority Data
Sep. 29, 2010    (EP) .................................... 10182035

(51) Int. Cl.
| H05K 5/00 | (2006.01) |
| H05K 1/14 | (2006.01) |
| H05K 7/14 | (2006.01) |
| E21B 33/035 | (2006.01) |
| H02G 3/08 | (2006.01) |
| H02G 9/02 | (2006.01) |
| H05K 5/06 | (2006.01) |
| H05K 3/36 | (2006.01) |

(52) U.S. Cl.
CPC .......... *H05K 7/1427* (2013.01); *E21B 33/0355* (2013.01); *H02G 3/088* (2013.01); *H02G 9/02* (2013.01); *H05K 5/067* (2013.01); *H05K 7/1434* (2013.01); *H05K 3/368* (2013.01)

(58) Field of Classification Search
USPC ...................... 361/679.01, 728, 736, 748, 752
See application file for complete search history.

(56) References Cited

U.S. PATENT DOCUMENTS

| 4,858,068 A | 8/1989 | Bitller et al. ............. 361/679.01 |
| 4,928,206 A * | 5/1990 | Porter et al. .................. 361/699 |

(Continued)

FOREIGN PATENT DOCUMENTS

| EP | 2131639 A2 | 12/2009 | ............ E21B 33/035 |
| FR | 2596231 A1 | 9/1987 | ................ F16B 2/14 |
| GB | 2180896 A | 4/1987 | ............... F16J 15/00 |
| WO | 2012/041531 A2 | 4/2012 | ................ H02G 9/02 |

OTHER PUBLICATIONS

International Preliminary Report on Patentability, Application No. PCT/EP2011/051716, 6 pages, Feb. 27, 2013.

*Primary Examiner* — Bernard Rojas
(74) *Attorney, Agent, or Firm* — King & Spalding L.L.P.

(57) ABSTRACT

An electrical subsea node for communicating data between at least one sensor at a sea bottom and a topside unit above the sea surface may include: a water tight container; a first electronic module extending in a first area of a first area size in a plane of a maximal spatial extent of the first electronic module; and at least one second electronic module extending in a second area of a second area size in a plane of a maximal spatial extent of the second electronic module, wherein the first and second electronic modules are coupled for data communication and arranged inside the container to form a module arrangement extending in an arrangement area of an arrangement area size in a plane of a maximal spatial extent of the module arrangement, wherein the arrangement area size is smaller than a sum of the first and second area sizes.

15 Claims, 3 Drawing Sheets

(56) References Cited

U.S. PATENT DOCUMENTS

| | | | |
|---|---|---|---|
| 6,778,389 B1* | 8/2004 | Glovatsky et al. | 361/690 |
| 7,196,838 B2* | 3/2007 | Adams et al. | 359/333 |
| 7,215,557 B2* | 5/2007 | Glovatsky et al. | 361/804 |
| 2012/0120963 A1* | 5/2012 | Davis | 370/401 |
| 2012/0314373 A1* | 12/2012 | Park | 361/715 |

* cited by examiner

ELECTRICAL SUBSEA NODE

CROSS-REFERENCE TO RELATED APPLICATIONS

This application is a U.S. National Stage Application of International Application No. PCT/EP2011/051716 filed Feb. 7, 2011, which designates the United States of America, and claims priority to EP Patent Application No. 10182035.5 filed Sep. 29, 2010 The contents of which are hereby incorporated by reference in their entirety.

TECHNICAL FIELD

The present disclosure relates to an electrical subsea node for communicating data between at least one sensor at a bottom of a sea and a top side unit above a surface of the sea and to a method for manufacturing such an electrical subsea node.

BACKGROUND

For operating subsea equipment, such as an equipment located at a bottom of a sea, such as 2000 m to 4000 m below the surface of the sea, an opportunity for supplying electrical power to the subsea equipment and the opportunity for communicating data between different components of the subsea equipment and a top side unit above the surface of the sea are required. In particular, electrical power provided by the top side unit may be required to be distributed among different components, such as nodes and/or devices, of the subsea equipment and measurement data and/or control data may be required to be appropriately routed to different components of the subsea equipment and/or routed to the top side unit.

For distributing or routing data, such as measurement data and/or control data, in particular between a sensor device or/and an actuator device on one hand and the top side unit on the other hand one or more subsea nodes may be employed which may be located at the bottom of the sea at which level also the measurement device and/or actuator device may be located.

It has been observed that it may be difficult to install a subsea node at a bottom of the sea and also that the subsea node may be very expensive to manufacture.

There may be a need for an electrical subsea node for communicating data between at least one sensor at a bottom of a sea and a top side unit above a surface of the sea and there may be a need for a method for manufacturing such an electrical subsea node, wherein at least some of the above-mentioned problems are reduced.

SUMMARY

One embodiment provides an electrical subsea node for communicating data between at least one sensor at a bottom of a sea and a topside unit above a surface of the sea, the electrical subsea node comprising: a water tight container; a first electronic module extending in a first area of a first area size in a plane of a maximal spatial extent of the first electronic module; and at least one second electronic module extending in a second area of a second area sizein a plane of a maximal spatial extent of the second electronic module, wherein the second electronic module is coupled to the first electronic module for data communication, wherein the first electronic module and the second electronic module are arranged inside the container to form a module arrangement extending in an arrangement area of an arrangement area size in a plane of a maximal spatial extent of the module arrangement, wherein the arrangement area size is smaller than a sum of the first area size and the second area size.

In a further embodiment, module arrangement is formed such that the first area and the second area at least partly overlap when viewed along a first direction perpendicular to the first area or along a second direction perpendicular to the second area.

In a further embodiment, the first area is aligned with respect to the second area such that an area size of an overlap between the first area and the second area amounts to between 0.5 and 1.0, in particular between 0.8 and 1.0, of the first area size or the second area size.

In a further embodiment, the first area is parallel to the second area.

In a further embodiment, the first area is spaced apart by a distance from the second area in a directions perpendicular to the first area.

In a further embodiment, the first electronic module is implemented on a first printed circuit board, in particular having a rectangular shape, and the second electronic module is implemented on a second printed circuit board, in particular having a rectangular shape.

In a further embodiment, the first printed circuit board has a same length as the second printed circuit board but a different width than the second printed circuit board.

In a further embodiment, the first printed circuit board has a same length and a same width as the second printed circuit board.

In a further embodiment, the container has a cylindrical shape having an inside cylinder height and an inside cylinder diameter, wherein a length direction of the first printed circuit board runs parallel to a cylinder height direction and/or wherein a length direction of the second printed circuit board runs parallel to the cylinder height direction.

In a further embodiment, the inside cylinder height is between 1.0 and 1.5 of a length in the length direction of the first printed circuit board and/or wherein the inside cylinder height is between 1.0 and 1.5 of a length in the length direction of the second printed circuit board.

In a further embodiment, the inside cylinder diameter is between 1.0 and 1.5 of a width of the first printed circuit board in a width direction perpendicular to the length direction of the first printed circuit board and/or wherein the inside cylinder diameter is between 1.0 and 1.5 of a width of the second printed circuit board in a width direction perpendicular to the length direction of the second printed circuit board.

In a further embodiment, the electrical subsea node further comprises: an internal data bus coupling the first electronic module and the second electronic module, wherein the internal data bus enables data communication between the first electronic module and the second electronic module.

In a further embodiment, the first electronic module comprises a topside communication unit for communicating data between the electrical subsea node and the topside unit and/or the second electronic module comprises a sensor communication unit for communicating data between the electrical subsea node and the at least one sensor.

In a further embodiment, the electrical subsea node further comprises: a frame supporting at least one of the first electronic module and the second electronic module and/or fixing at least one of the first electronic module and the second electronic module at an inside of the container.

Another embodiment provides a method for manufacturing an electrical subsea node for communicating data between at least one sensor at a sea bottom and a topside unit above a surface of the sea, the method comprising: providing a water tight container; providing a first electronic module extending in a first area of a first area size in a plane of a maximal extent of the first electronic module; providing at least one second electronic module extending in a second area of a second area size in a plane of a maximal extent of the second electronic module, electrically connecting the second electronic module to the first electronic module; and arranging the first electronic module and the second electronic module inside the container such as to form a module arrangement extending in an arrangement area of an arrangement area size in a plane of a maximal extent of the module arrangement, wherein the arrangement area size is smaller than a sum of the first area size and the second area size.

BRIEF DESCRIPTION OF THE DRAWINGS

Exemplary embodiments will be explained in more detail below based on the schematic drawings, wherein.

DETAILED DESCRIPTION

According to an embodiment an electrical subsea node (such as a canister harbouring electronic circuitry adapted for providing a data communication interface to a top side unit and also providing one or more electrical data interfaces for communicating with one or more subsea devices, such as a measurement device and/or a sensor device and/or an actuator device) for communicating data (such as measurement data and/or control data, the measurement data being in particular provided by a sensor device measuring a physical quantity at the installation side, such as at the bottom of the sea; the control data being in particular provided by the electrical subsea node or by the topside unit for controlling the one or more subsea devices, in particular for controlling a sensor and/or an actuator comprised in the one or more subsea devices) between at least one sensor (or sensor device or sensor unit providing the capability of measuring a physical quantity, such as a temperature and/or a pressure, in particular related to an oil bore or oil bore equipment) at a bottom of a sea (such as in a depth between 1000 m and 4000 m below the surface level of the sea) and a topside unit (such as a platform swimming in the sea) above a surface of the sea is provided, wherein the electrical subsea node comprises a water tight container (in particular comprising a container wall adapted to withstand a high water pressure, such as a water pressure at a depth between 1000 m and 4000 m, the container being in particular closed in a water tight manner by one or more seals, the container in particular allowing a connection of one or more wire lines for communicating data between the electrical subsea node on one hand and the sensor or the topside unit on the other hand); a first electronic module (in particular comprising electronic circuitry for receiving and/or generating electrical signals, for transforming the electrical signals, and/or digitizing the electrical signals) extending in a first area (extending in particular in a first direction and a second direction different from the first direction) of a first area size (being the size of the first area) in a plane of a maximal spatial extent (in particular the plane perpendicular to a thickness direction of the first electronic module, in particular, if the first electronic module is implemented on a printed circuit board, the plane of the maximal extent being the plane of the printed circuit board) of the first electronic module; and at least one second electronic module (which may in particular comprise an electronic circuitry different from the electronic circuitry comprised in the first electronic module) extending in a second area of a second area size (being the size of the second area) in a plane of a maximal spatial extent of the second electronic module, wherein the second electronic module is coupled (in particular electrically or optically or electromagnetically coupled) to the first electronic module for data communication between the first electronic module and the second electronic module, wherein the first electronic module and the second electronic module are arranged inside the container (such that the container walls in particular enclose the first electronic module as well as the second electronic module in a water tight manner, such that both electronic modules are protected from seawater) to form a module arrangement (i.e. an arrangement of the first electronic module and the second electronic module being in particular characterized by a positioning and/or an orientation of the first electronic module relative to the second electronic module) extending in an arrangement area of an arrangement area size (being the size of the arrangement area) in a plane of a maximal spatial extent of the module arrangement (in particular, the plane of the maximal spatial extent of the module arrangement may be the plane of the maximal extent of the first electronic module or of the second electronic module), wherein the arrangement area size is smaller than a sum of the first area size and the second area size.

Thereby, the electronic circuitry comprised in the electrical subsea node requires less area size than when the first electronic module and the second electronic module would be placed side by side in the plane of maximal extent of the first electronic module or the second electronic module. Thereby, the size, in particular a base size, of the electrical subsea node may be reduced compared to a conventional electrical subsea node. Thereby, in particular a container wall thickness may be reduced compared to an electrical subsea node having a larger size. Thereby, in particular the electrical subsea node may be manufactured in a more cost-effective way and may require less weight. In turn, an installation of the electrical subsea node at the bottom of the sea may be simplified.

According to an embodiment the module arrangement is formed (in particular comprising positioning and/or orienting the first electronic module relative to the second electronic module) such that the first area and the second area at least partly overlap (in particular overlap in projection along the first direction or along the second direction) when viewed along a first direction perpendicular to the first area or along a second direction perpendicular to the second area. In particular, the first direction may be a thickness direction of the first electronic module and the second direction may be a thickness direction of the second electronic module. In particular, the first electronic module and the second electronic module may be stacked on top of each other.

The first electronic module is coupled to the second electronic module for data communication between the first electronic module and the second electronic module, such as a bidirectional data communication. Thereby, the data communication may be an optical data communication, a wireless data communication, such as by electromagnetic waves, in particular radio frequency electromagnetic waves, such as by Bluetooth or using a wireless area network, or the data communication may be wire-based by electrically connecting the first electronic module with the second electronic module by an electrical cable, such as an Ethernet cable or any other cable suitable for data communication, such as a bus communication.

In particular, the first area and the second area may be positioned and oriented relative to each other such that the overlap (in particular in projection) along the first direction or the second direction is maximal. Thereby, the size of the container and thus the entire electrical subsea node may be further reduced, to reduce the weight of the electrical subsea node and also an installation procedure for installing the electrical subsea node at the bottom of the sea.

According to an embodiment the first area is aligned (in particular positioned, localized and/or oriented) with respect to the second area (in particular relative to the second area) such that an area size of an overlap between the first area and the second area amounts to between 0.5 and 1.0, in particular to between 0.8 and 1.0, of the first area size or the second area size. In particular, a maximal overlap may be achieved, when the area size of the overlap amounts to 1.0 of the first area or the second area size.

According to an embodiment the first area (in particular a plane the first area is situated in) is parallel to the second area (in particular a plane the second area is situated in). Thereby, the first electronic module and the second electronic module may be stacked on each other such as to reduce the arrangement area size and at the same time providing a constant distance between the first electronic module and the second electronic module. In particular, the first electronic module may be spaced apart from the second electronic module in a direction perpendicular to the first area or perpendicular to the second area. Thereby, unintended connection between electronic components comprised in the first electronic module and/or the second electronic module may be avoided by having a substantially constant distance between the first electronic module and the second electronic module which are spaced apart and arranged parallel to each other.

According to an embodiment the first electronic module is implemented on a first printed circuit board (in particular a printed circuit board mechanically supports and electrically connects electronic components comprised in the first electronic module, wherein in particular signal traces may be etched from copper sheets laminated onto a non-conductive substrate of the printed circuit board, wherein in particular the non-conductive substrate may have a main surface defining the area of maximal spatial extent, wherein an extent in the thickness direction perpendicular to the plane of maximal spatial extent is at least 100 times smaller than the extent of the main surface of the printed circuit board), in particular having a rectangular shape (or a quadratic shape), and the second electronic module is implemented on a second printed circuit board (having in particular conductive traces being different from the conductive traces on the first printed circuit board), in particular also having a rectangular shape. Thereby, the first electronic module and the second electronic module may be manufactured using conventional methods and materials. Thereby, the costs of the electronic subsea node may be reduced.

According to an embodiment the first printed circuit board has a same length (the length being in particular an extent in one direction which is parallel to a longest edge of the first printed circuit board) as the second printed circuit board but a different width (being in particular an extent in another direction being parallel to a shortest edge of the first printed circuit board) than the second printed circuit board. Thereby, the first printed circuit board and the second printed circuit board may in particular be arranged in a container having a cylindrical shape, wherein the printed circuit board having the largest width may be placed in the container close to a diameter line and the printed circuit board having a smaller width than the maximal width may be placed spaced apart from the diameter line. Thereby, a large number of printed circuit boards, such as 2, 3, 4, 5, 6, 7 or between 10 and 20 printed circuit boards may be enclosed within the container.

According to an embodiment the first printed circuit board has a same length and a same width as the second printed circuit board. In particular, the first printed circuit board and the second printed circuit board may be positioned within the container spaced apart from the diameter line of the container by a same amount.

According to an embodiment the container has a cylindrical shape (in particular having a circular base area and having a height, wherein the base area has a diameter) having an inside cylinder height (a free height within the container to accommodate the first electronic module and the second electronic module, the inside cylinder height being in particular smaller than an outside cylinder height because of the thickness of the container wall) and an inside cylinder diameter (being a free diameter of the base area of the container, the inside cylinder diameter being in particular smaller than an outside cylinder diameter due to the container wall), wherein a length direction (a direction along or parallel to a largest edge) of the first printed circuit board runs parallel to a cylinder height direction (being the direction parallel to a cylindrical symmetry axis of the cylinder) and/or wherein a length direction of the second printed circuit board runs parallel to the cylinder height direction. In particular, a ratio between a height of the cylinder and the diameter of the cylinder may amount to between 10:1 and 2:1, in particular between 6:1 and 4:1. In particular, it may be advantageous to design the container such that the height is one or more times larger than the diameter, in order to strengthen the container and such that the base area of the cylinder may be kept at a relatively low area size, since the base area is a substantially plane area requiring a relatively thick container wall in the base area to withstand the high water pressure at the bottom of the sea.

According to an embodiment the inside cylinder height is between 1.0 and 1.5 times a length in the length direction of the first printed circuit board and/or wherein the inside cylinder height is between 1.0 and 1.5 times a length in the length direction of the second printed circuit board. Thus, the first printed circuit board and also the second printed circuit board fits inside the container, in particular in such a way that a remaining space is reduced, in order to accompany as much as possible area of the printed circuit boards within the container.

According to an embodiment the inside cylinder diameter is between 1.0 and 1.5 times a width (an extent of a shortest edge) of the first printed circuit board in a width direction perpendicular to the length direction of the first printed circuit board and/or wherein the inside cylinder diameter is between 1.0 and 1.5 times a width of the second printed circuit board in a width direction perpendicular to the length direction of the second printed circuit board. Thus, the first electronic module and the second electronic module fit inside the container, in particular such that a remaining space is reduced or minimized.

According to an embodiment the electrical subsea node further comprises an internal data bus coupling the first electronic module and the second electronic module for data communication (in particular using an optical communication, a wireless communication, or a wire-based communication), wherein the internal data bus enables data communication between the first electronic module and the second electronic module. The internal data bus may define a data communication protocol between the first electronic module and the second electronic module, such as an Ethernet protocol, or any other suitable data communication protocol. In particular, each of the first electronic module and the second electronic module may comprise an appropriate interface for interfacing the internal data bus.

According to an embodiment the first electronic module comprises a topside communication unit (such as an interface for communicating data to the topside unit) for communicating data between the electrical subsea node and the topside unit (in particular using a wire-based communication technique) and/or wherein the second electronic module comprises a sensor communication unit (in particular a sensor interface) for communicating data between the electrical subsea node and the at least one sensor. Alternatively and/or additionally the second electronic module may comprise an interface for data communication to an actuator.

In particular, the electrical subsea node may comprise a plurality of second electronic modules each having a sensor communication unit, wherein the sensor communication units comprised in the different second electronic modules may be mutually different from each other. Thereby, the electrical subsea node may be adapted for communicating to a number of different sensors adhering to different communication protocols or communication types. In particular, one of the second electronic modules may comprise a 4-20 mA sensor interface, one may comprise a fault tolerant CAN-interface and still another may comprise a profibus-interface. In particular, the electrical subsea node may comprise 1, 2, 3, 4, 5 or 5 to 10 second electronic modules each comprising a particular sensor interface unit for communicating with a corresponding number of (different or same) sensors, in particular for measuring temperature and/or pressure at the bottom of the sea, in particular close to an oil bore.

According to an embodiment the electrical subsea node further comprises a frame supporting at least one of the first electronic module and the second electronic module and/or fixing at least one of the first electronic module and the second electronic module at an inside of the container. Thereby, the electronic modules may be secured within the container such that they can withstand oscillations or vibrations occurring at the installation side, in particular close to an oil bore. Thereby, the reliability of the electrical subsea node may be improved.

According to an embodiment a method for manufacturing an electrical subsea node for communicating data between at least one sensor at a sea bottom and a topside unit above a surface of the sea is provided, wherein the method comprises providing a water tight container; providing a first electronic module extending in a first area of a first area size in a plane of a maximal extent of the first electronic module; providing at least one second electronic module extending in a second area of a second area size in a plane of a maximal extent of the second electronic module; coupling the second electronic module to the first electronic module for allowing data communication; and arranging the first electronic module and the second electronic module inside the container such as to form a module arrangement extending in an arrangement area of an arrangement area size in a plane of a maximal extent of the module arrangement, wherein the arrangement area size is smaller than a sum of the first area size and the second area size.

It should be understood that features (individually or in any combination) disclosed, described, explained, mentioned or provided in respect to a description of an embodiment of an electrical subsea node for communicating data between at least one sensor at a bottom of a sea and topside unit above a surface of the sea may also be used for, provided, employed or applied to a method for manufacturing an electrical subsea node according to an embodiment.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the example embodiments described below. However, the invention is not limited to the example embodiments discussed below.

Figure 1:
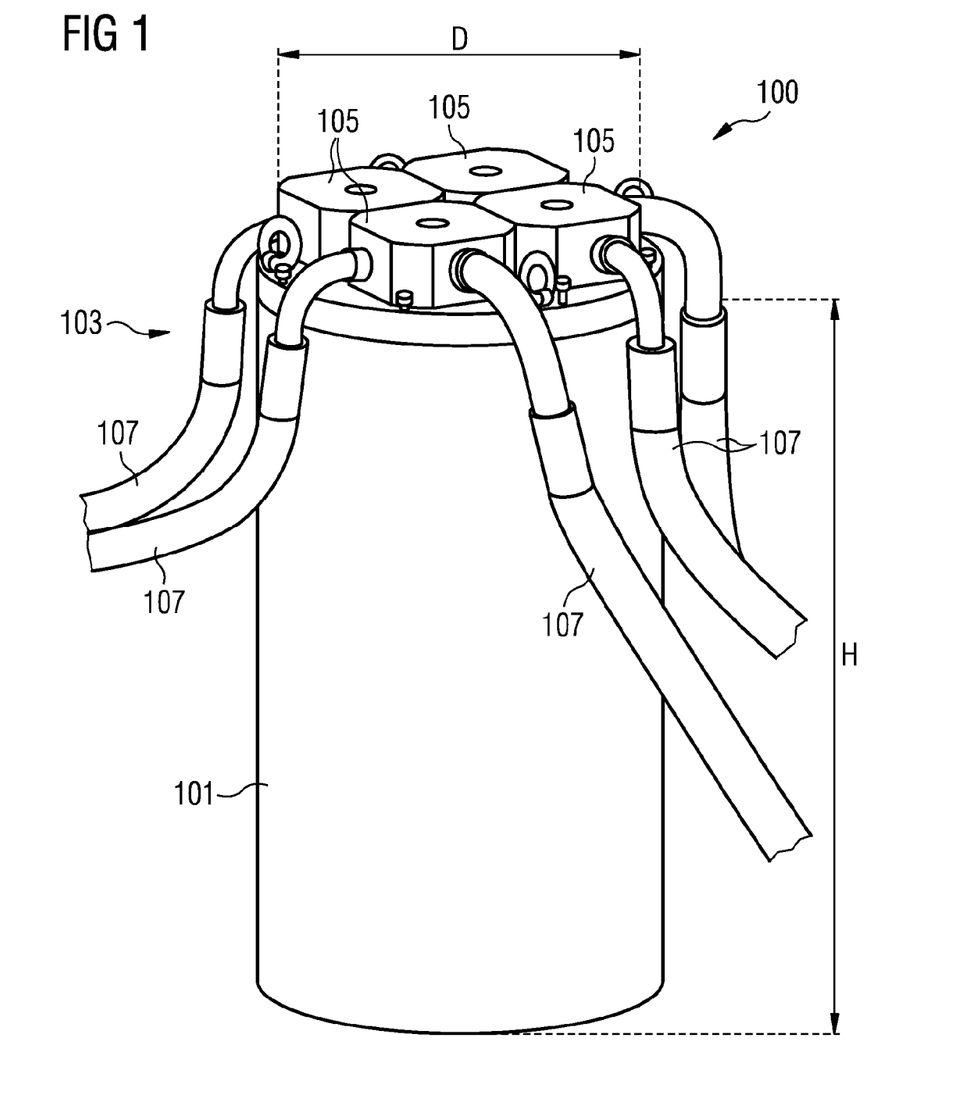
FIG. 1 illustrates a perspective view of an electrical subsea node according to an embodiment.

FIG. 1 illustrates a perspective view of an electrical subsea node 100 according to an embodiment. The electrical subsea node 100 (which may also be referred to as a subsea canister or just a canister) is adapted to collect and cluster data to and from several different types of subsea connectors into one main data stream which may lead to a topside equipment or to a topside unit.

The electrical subsea node 100 comprises a water tight container 101 which is here embodied as a cylindrical shaped container which is also called a canister. The container 101 is manufactured from a particular metal being resistive to sea water. At a base portion 103 the electrical subsea node 100 comprises four connectors 105 for connecting wires 107 to an electronic circuitry housed in an inside of the container 101. In particular, three different external sensors (data sources) and one uplink (data sink) leading to the topside unit may be connected to the electrical subsea node 100 using the wires 107 and the connectors 105.

Figure 2:
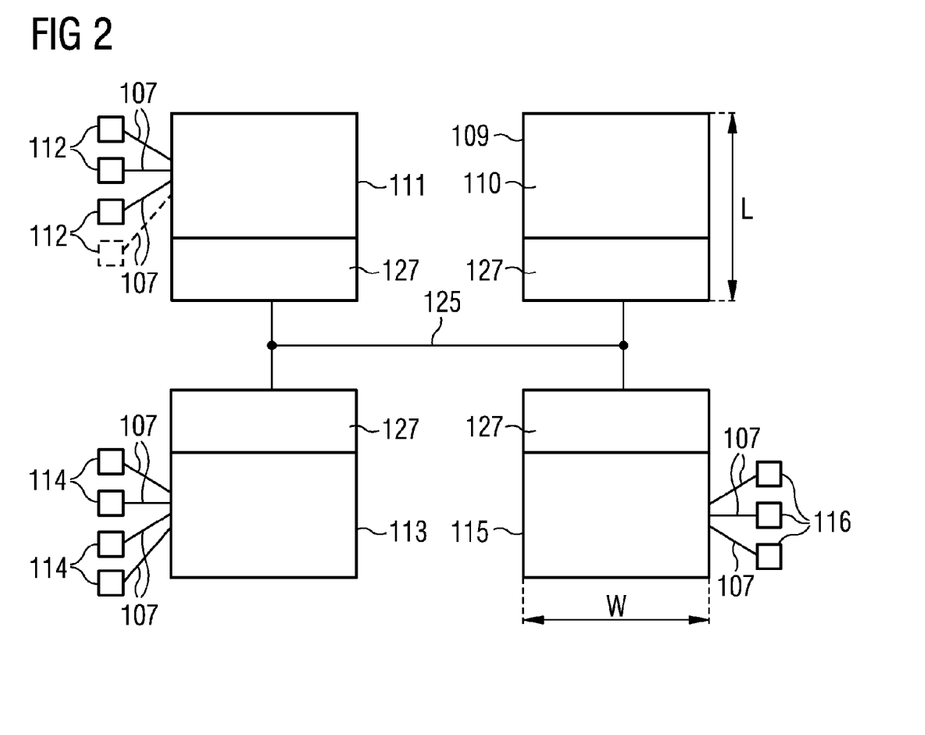
FIG. 2 schematically illustrates four electronic modules comprised in the electrical subsea node illustrated in FIG. 1.

FIG. 2 schematically illustrates a first electronic module 109 and three second electronic modules 111, 113 and 115 which are accompanied within the container 101 of the electrical subsea node 100 illustrated in FIG. 1. As examples, module 111 comprises a 4-20 mA Sensor (sensor input), module 109 comprises a Profinet (Topside link) 110, module 113 comprises a Fault Tolerant CAN (Sensor input), module 115 comprises a Profibus (sensor input). Reference sign 127 denotes a Generic Bus converter. The first electronic module 109 as well as the second electronic modules 111, 113 and 115 are implemented on a corresponding printed circuit board. As is indicated in FIG. 2 the printed circuit boards of the electronic modules 109, 111, 113, 115 have a length L being a length of a largest edge of the printed circuit boards and have a width W being a length of a shortest edge of the electronic modules or printed circuit boards of the electronic modules 109, 111, 113 and 115. In particular, the length L may correspond (or be at least approximately equal) to an inside height H of the container 101, as illustrated in FIG. 1. Further, the width W may be equal to or smaller than a diameter (in particular inside diameter) D of the container 101 illustrated in FIG. 1.

Via the cables 107 the printed circuit board 111 is connected to one or more sensors 112 being sensors of type 4-20 mA-sensors, thus providing a particular conventional data communication protocol. Further, the printed circuit board 113 is connected via the cables 107 to one or more sensors 114 which adhere to the fault tolerant CAN-data communication protocol. The electronic circuit board 115 is connected via wires 107 to one or more sensors 116 which provide a profibus for data communication.

In operation the sensors 112, 114 or 116 may provide measuring data, such as relating to pressure and/or temperature, to the printed circuit boards 111, 113 or 116 which may communicate these measurement data via their interfaces 127 over the internal bus 125 to the printed circuit board 109 which comprises a profinet interface to communicate the measurement data to a topside unit above the surface of the sea.

Figure 3:
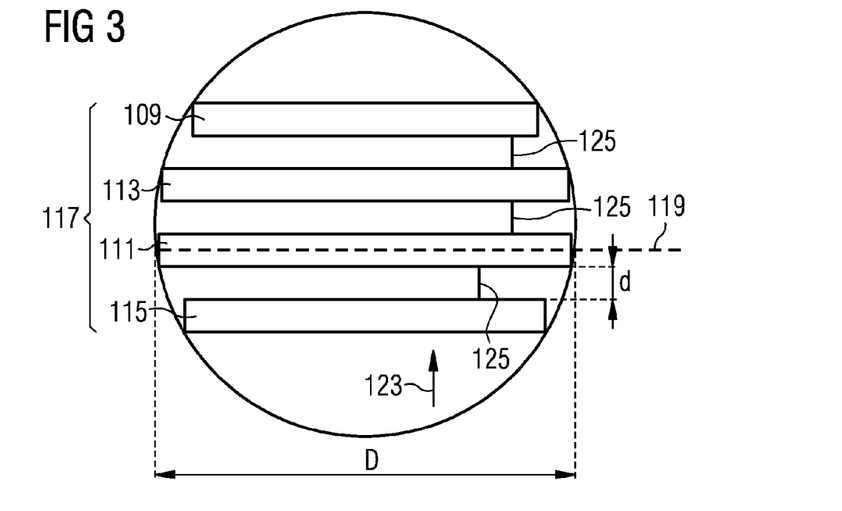
FIG. 3 schematically illustrates a plan view along a symmetry axis of the electrical subsea node illustrated in FIG. 1.

In particular, as is illustrated in FIG. 3 showing a plan view of the opened electrical subsea node 100 illustrated in FIG. 1, the four printed circuit boards 109, 111, 113 and 115 may be stacked on top of each other to form an assembly 117 which fits into the inside of the container 101 of the electrical subsea node illustrated in FIG. 1.

Figure 4:
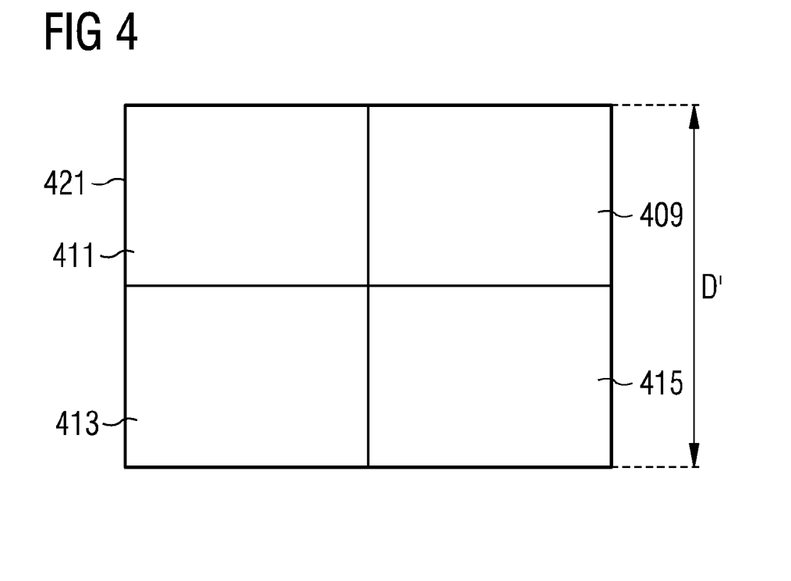
FIG. 4 illustrates a printed circuit board according to the prior art.

In particular, the printed circuit boards 109, 111, 113 and 115 are arranged parallel to each other being spaced apart by a distance d. In particular, an area size of the arrangement 117 in a plane 119 of a maximal spatial extent of the module arrangement 117 amounts to D×L which is smaller than an area size 4×L×D of the sum of the area sizes of the printed circuit boards 109, 111, 113 and 115. Thereby, for harbouring a particular area size of the combination of the printed circuit boards 109, 111, 113 and 115 the diameter D of the base of the cylindrical container 101 may be made smaller than in a conventional case, wherein the four electronic modules 109, 111, 113 and 115 are implemented on a single printed circuit board 421, as illustrated in FIG. 4. In a conventional electrical subsea node 500 illustrated in FIG. 5 the single printed circuit board 421 having a width D' is accompanied within a container wall 501 having a diameter D' which is larger than the diameter D of the container 101 of the electrical subsea node 100 according to an embodiment.

Figure 5:
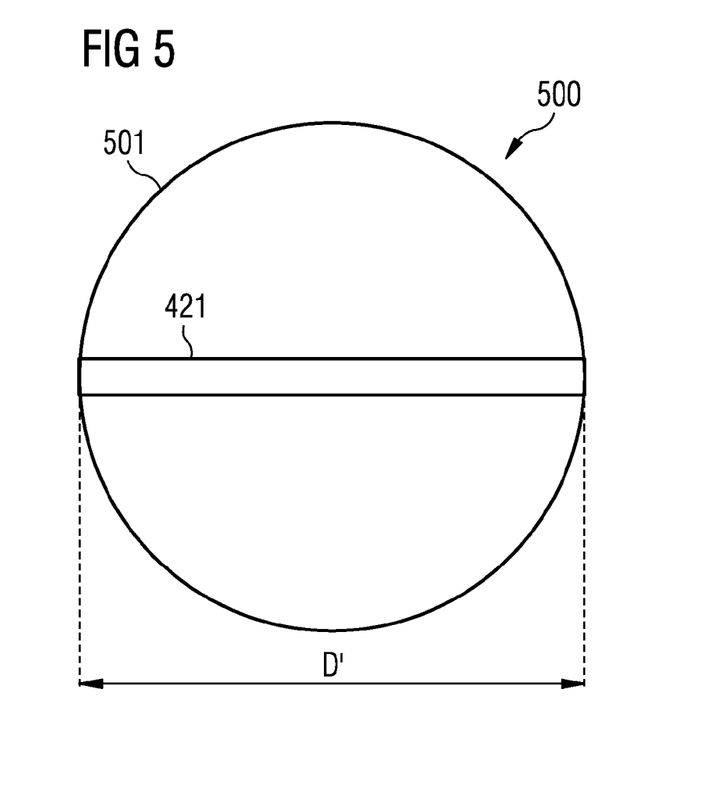
FIG. 5 illustrates an electrical subsea node comprising the printed circuit board illustrated in FIG. 4 according to the prior art.

According to the conventional electrical subsea node illustrated in FIG. 5 the diameter D' of the container 501 is proportional to the width D' of the single printed circuit board 421 illustrated in FIG. 4. The weight of the conventional subsea canister is also proportional to the area of the printed circuit board 421.

In particular, the areas of the printed circuit boards 109, 111, 113 and 115 overlap when viewed along a first direction 123 which is perpendicular to the plane 119 defining a plane parallel to the areas of the printed circuit boards 109, 111, 113 and 115. In particular, the overlap is maximal when the printed circuit boards are arranged according to the module arrangement 117 illustrated in FIG. 3. As can be seen from FIG. 3, the widths of the printed circuit boards 113 and 111 have a same value, while the widths of the printed circuit boards 109 and 115 are smaller than the widths of the printed circuit boards 111 and 113. Thereby, more space available within the container 101 is occupied by the printed circuit boards, since also the printed circuit boards 109 and 115 fit within the container 101.

According to an embodiment the area of the printed circuit board is decreased by splitting it in several small printed circuit boards which interconnect through an internal generic bus 125 as illustrated in FIG. 2.

If the size of the printed circuit boards is decreased in the width direction and instead is increased in the length direction, the total area size of the printed circuit boards used may be larger, but since the printed circuit boards are stacked on top of each other, the size of the complete solution 117 may give a much better utilization of the area inside the subsea canister or electrical subsea node 100. By partitioning the design over several printed circuit boards 109, 111, 113 and 115 the total volume of the subsea canister or electrical subsea node 100 is utilized in a more effective way and the size and the weight of the subsea canisters may be decreased, while the possible area size of the arrangement 117 of printed circuit boards may be increased. Thereby, it is required that each printed circuit board 109, 111, 113 and 115 has a generic bus interface 127 by which the corresponding printed circuit board can communicate to any other printed circuit board via the internal bus 125. In particular, the interface may be implemented with any bit serial standard bus interface.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

What is claimed is:

1. Electrical subsea node for communicating data between at least one sensor at a bottom of a sea and a topside unit above a surface of the sea, the electrical subsea node comprising:
   a water tight container;
   a first electronic module extending in a first area of a first area size in a plane of a maximal spatial extent of the first electronic module; and
   at least one second electronic module extending in a second area of a second area size in a plane of a maximal spatial extent of the second electronic module, wherein the second electronic module is coupled to the first electronic module for data communication,
   wherein the first electronic module and the second electronic module are arranged inside the container to form a module arrangement extending in an arrangement area of an arrangement area size in a plane of a maximal spatial extent of the module arrangement,
   wherein the arrangement area size is smaller than a sum of the first area size and the second area size,
   wherein the first electronic module is implemented on a first printed circuit board having a rectangular shape, and the second electronic module is implemented on a second printed circuit board having a rectangular shape,
   wherein the first printed circuit board has a same length as the second printed circuit board but a different width than the second printed circuit board,
   wherein the container has a cylindrical shape having an inside cylinder height and an inside cylinder diameter, wherein a length direction of the first printed circuit board runs parallel to a cylinder height direction and wherein a length direction of the second printed circuit board runs parallel to the cylinder height direction.

2. Electrical subsea node of claim 1, wherein module arrangement is formed such that the first area and the second area at least partly overlap when viewed along a first direction perpendicular to the first area or along a second direction perpendicular to the second area.

3. Electrical subsea node of claim 2, wherein the first area is aligned with respect to the second area such that an area size of an overlap between the first area and the second area amounts to between 0.5 and 1.0, in particular between 0.8 and 1.0, of the first area size or the second area size.

4. Electrical subsea node of claim 1, wherein the first area is parallel to the second area.

5. Electrical subsea node of claim 4, wherein the first area is spaced apart by a distance from the second area in a directions perpendicular to the first area.

6. Electrical subsea node of claim 1, wherein the inside cylinder height is between 1.0 and 1.5 of a length in the length direction of the first printed circuit board.

7. Electrical subsea node of claim 6, wherein the inside cylinder height is between 1.0 and 1.5 of a length in the length direction of the second printed circuit board.

8. Electrical subsea node of claim 1, wherein the inside cylinder diameter is between 1.0 and 1.5 of a width of the first printed circuit board in a width direction perpendicular to the length direction of the first printed circuit board.

9. Electrical subsea node of claim 8, wherein the inside cylinder diameter is between 1.0 and 1.5 of a width of the second printed circuit board in a width direction perpendicular to the length direction of the second printed circuit board.

10. Electrical subsea node of claim 1, further comprising an internal data bus coupling the first electronic module and the second electronic module, wherein the internal data bus enables data communication between the first electronic module and the second electronic module.

11. Electrical subsea node of claim 1, wherein the first electronic module comprises a topside communication unit for communicating data between the electrical subsea node and the topside unit.

12. Electrical subsea node of claim 11, wherein the second electronic module comprises a sensor communication unit for communicating data between the electrical subsea node and the at least one sensor.

13. Electrical subsea node of claim 1, further comprising a frame supporting at least one of the first electronic module and the second electronic module.

14. Electrical subsea node of claim 13, wherein the frame fixes at least one of the first electronic module and the second electronic module at an inside of the container.

15. Method for manufacturing an electrical subsea node for communicating data between at least one sensor at a sea bottom and a topside unit above a surface of the sea, the method comprising:

providing a water tight container;

providing a first electronic module extending in a first area of a first area size in a plane of a maximal extent of the first electronic module;

providing at least one second electronic module extending in a second area of a second area size in a plane of a maximal extent of the second electronic module, electrically connecting the second electronic module to the first electronic module; and arranging the first electronic module and the second electronic module inside the container such as to form a module arrangement extending in an arrangement area of an arrangement area size in a plane of a maximal extent of the module arrangement, wherein the arrangement area size is smaller than a sum of the first area size and the second area size, wherein the first electronic module is implemented on a first printed circuit board having a rectangular shape, and the second electronic module is implemented on a second printed circuit board having a rectangular shape, wherein the first printed circuit board has a same length as the second printed circuit board but a different width than the second printed circuit board, wherein the container has a cylindrical shape having an inside cylinder height and an inside cylinder diameter, wherein a length direction of the first printed circuit board runs parallel to a cylinder height direction and wherein a length direction of the second printed circuit board runs parallel to the cylinder height direction.

* * * * *